(12) United States Patent
Quinn

(10) Patent No.: US 6,747,259 B1
(45) Date of Patent: Jun. 8, 2004

(54) ASSEMBLY OF IMAGING ARRAYS FOR LARGE FORMAT DOCUMENTS

(75) Inventor: Kraig A. Quinn, Webster, NY (US)

(73) Assignee: Xerox Corporation, Stamford, CT (US)

(*) Notice: Subject to any disclaimer, the term of this patent is extended or adjusted under 35 U.S.C. 154(b) by 615 days.

(21) Appl. No.: 09/677,742

(22) Filed: Oct. 3, 2000

(51) Int. Cl.⁷ .............................................. H01L 27/00
(52) U.S. Cl. ................................................ 250/208.1
(58) Field of Search .......................... 250/208.1, 214.1, 250/214 R

(56) References Cited

U.S. PATENT DOCUMENTS

| | | | |
|---|---|---|---|
| 4,814,296 A | 3/1989 | Jedlicka et al. | 437/226 |
| 4,954,197 A | 9/1990 | Jedlicka et al. | 156/273.7 |
| 4,976,802 A | 12/1990 | LeBlanc | 756/273.5 |
| 5,034,083 A | 7/1991 | Campanelli et al. | 156/273.5 |
| 5,063,286 A | * 11/1991 | Kaneko | 250/208.1 |
| 5,079,185 A | 1/1992 | Kagawa et al. | 437/129 |
| 5,079,189 A | 1/1992 | Drake et al. | 437/209 |
| 5,097,274 A | 3/1992 | Drake et al. | 346/140 R |
| 5,262,634 A | 11/1993 | Suzuki | 250/208 |
| 5,272,113 A | 12/1993 | Quinn | 437/205 |
| 5,528,272 A | 6/1996 | Quinn et al. | 347/42 |
| 5,912,746 A | 6/1999 | Cilke et al. | 358/482 |

OTHER PUBLICATIONS

Lactite Corp., *Loctite Light Cure Technology*, www.loctite.com/lightcure/.

* cited by examiner

*Primary Examiner*—Thanh X. Luu
(74) *Attorney, Agent, or Firm*—David J. Arthur

(57) ABSTRACT

An imaging apparatus is formed of two or more imaging subarrays. Each imaging subarray is formed of a printed wiring board containing semiconductor imaging chips. The end chip of each board projects beyond the edge of the board. The imaging subarrays are joined together so that the projecting end chips may be closely spaced from one and another, without the circuit boards contacting one another. Glass tie bars formed of a low thermal expansion glass secure the boards to one another. A light curable adhesive secures each tie bar to the printed wiring board.

11 Claims, 4 Drawing Sheets

ASSEMBLY OF IMAGING ARRAYS FOR LARGE FORMAT DOCUMENTS

FIELD OF THE INVENTION

The present invention pertains to large arrays of imaging devices. A preferred implementation of the invention is applied to very long linear arrays of either photosensors or image creating structures. Such long linear arrays can be used to record or create large format documents such as posters or engineering drawings.

BACKGROUND OF THE INVENTION

Image sensors for scanning document images typically have a row or linear array of photosensors together with suitable supporting circuitry integrated onto a silicon chip. Analogous devices for creating images in response to digital image data, such as LED print bars in Xerographic printers, or ink jet printheads, include a linear array of image creating structures similarly integrated onto a semiconductor silicon chip. In either case, because of the difficulty in economically designing and fabricating an array comparable in length to the width of an image to be created or recorded, various additional structures are typically used. In the scanning context, an optical reduction structure may be used to optically reduce the original image so that light from the image is reduced to the array of a single chip. In creating an image, a single chip can be reciprocated across the document. For example, in ink jet printing, a carriage may reciprocate a single chip for numerous swaths across an image substrate to create the image. However, certain advantages can be achieved if an array can be structured to record or create a very large image directly, using a full-width array.

In the scanning context, a full-width scanning device is described in U.S. Pat. No. 5,272,113. In the device described in that reference, several individual silicon chips, each with a small linear array of imaging structures thereon, are placed on a substrate in an end-to-end relationship to form what is effectively a single page width array of photosensors. A challenge of creating such a single full-width array is spacing the chips relative to one another so that the photosensors of the array are evenly spaced with a minimum of anomalies, particularly between the last photosensor of one chip and the first photosensor of the adjacent chip. Complicating the spacing challenge is that the coefficient of thermal expansion of the chips themselves may differ from the coefficient of thermal expansion of the printed wiring board or other structure upon which the chips are mounted.

SUMMARY OF THE INVENTION

The apparatus of the present invention is an imaging apparatus that includes first and second substrates, a first imaging device mounted on the first substrate, and a second imaging device mounted on the second substrate. A glass tie bar has a first portion attached to the first substrate, and a second portion attached to the second substrate. In particular implementations, the first and second portions of the tie bar are attached to the first and second substrates by an adhesive cured by a mechanism other than heat, such as by a light curable adhesive.

The method of the present invention is a method of forming an imaging apparatus. The method includes forming a first imaging subarray that includes a first printed wiring board, and a plurality of first semiconductor imaging chips, including a first end chip. The first printed wiring board has a joining end, and a portion of the first end chip projects beyond the joining end of the first printed wiring board. The method further includes forming a second imaging subarray that includes a second printed wiring board, and a plurality of second semiconductor imaging chips, including a second end chip. The second printed wiring board has a joining end, and a portion of the second end chip projects beyond the joining end of the second printed wiring board. The method further includes bringing the first imaging subarray into proximity with the second imaging subarray so that the first end chip is immediately adjacent the second end chip. A light curable adhesive is applied to the first board and to the second board. A glass tie bar is placed so that a first portion of the tie bar contacts the light curable adhesive on the first board, and a second portion of the tie bar contacts the light curable adhesive on the second board. Light is directed onto the light curable adhesive to cure the light curable adhesive.

DETAILED DESCRIPTION OF A PREFERRED EMBODIMENTS

Figure 1:
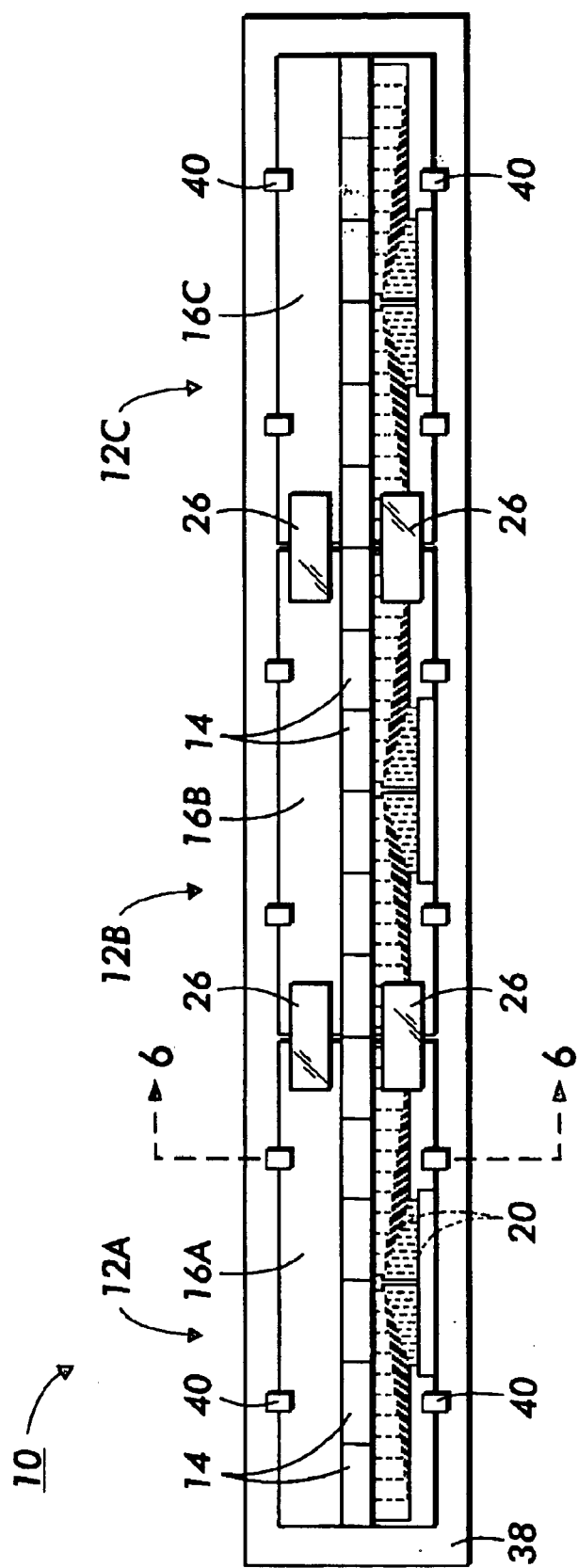
FIG. 1 is a plan view showing an assembly of imaging arrays, according to one aspect of the present invention.
Figure 2:
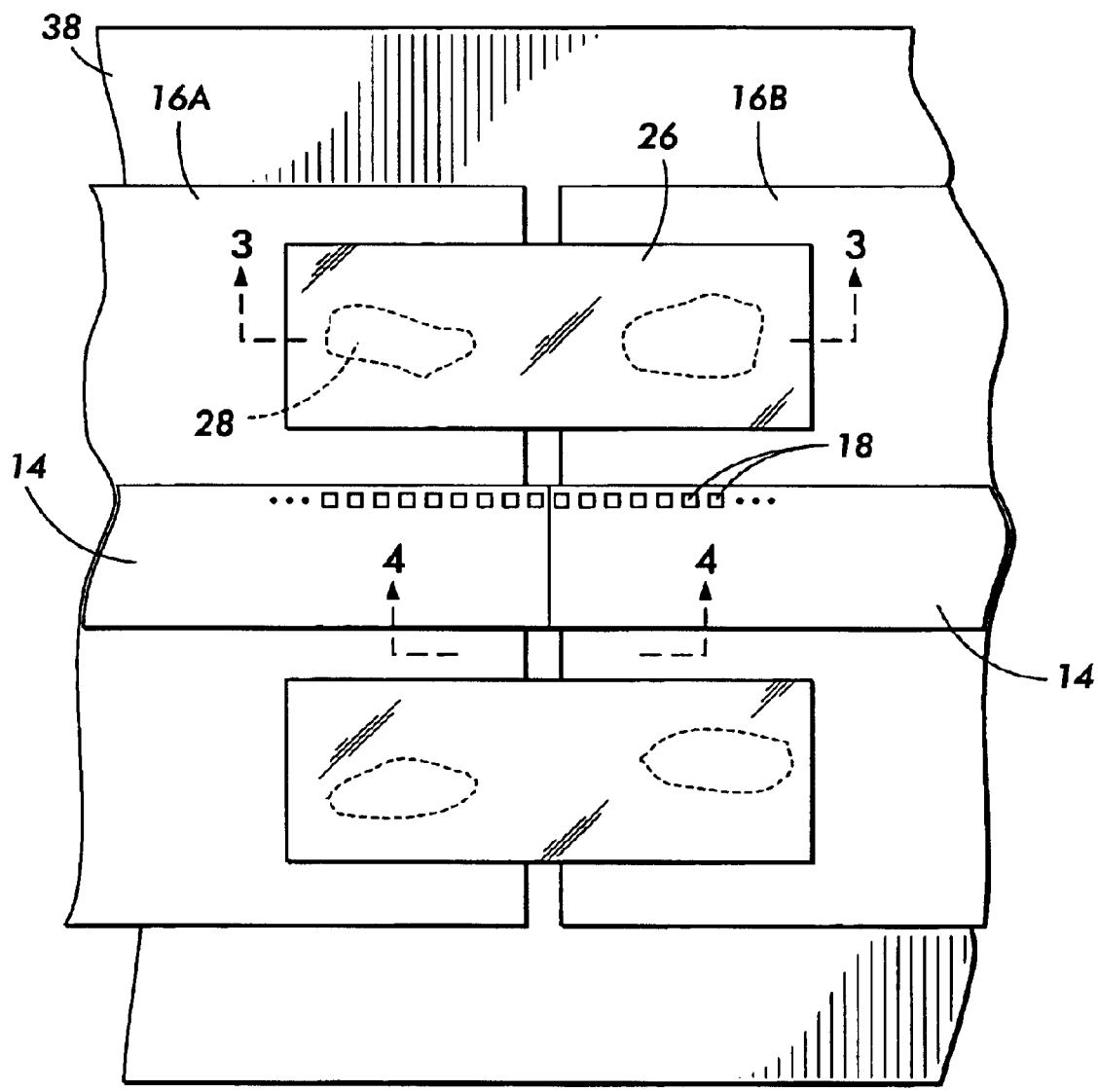
FIG. 2 is an enlarged plan view of a portion of the assembly shown in FIG. 1, illustrating the connection between adjacent arrays.

Referring first to FIG. 1, an extended length linear array 10 of imaging chips, in accordance with an aspect of the present invention is formed of a plurality of imaging subarrays 12. Each imaging subarray 12 contains a plurality of silicon semiconductor imaging chips 14 mounted on a supporting substrate, such as a printed wiring board 16. As seen in FIG. 2, each semiconductor imaging chip 14 includes thereon an array of individual imaging structures 18, such as photosensors, or LED emitters, or portions of ink jet ejectors. In the particular configuration illustrated, the individual imaging structures 18 on a single chip are arranged in a linear fashion. In addition, adjacent chips are arranged so that the imaging structures of the adjacent chips are aligned with one another. Thus, the imaging structures of the chips of a single imaging subarray 12 are arranged in a linear fashion. Each printed wiring board 16 on which an imaging subarray is formed may further include thereon printed circuitry 20 to enable external circuitry to access the circuitry on each semiconductor chip 14. The printed wiring boards 16 may be formed of conventional printed wiring board material, or of low thermal expansion Ceracom™ printed wiring board material, which has a coefficient of thermal expansion of 5.9 parts per million per degree Celsius (5.9 ppm/° C.). Ceracom™ printed wiring board material is available from Ibiden Co., Ltd. of Ogaki, Gifu, Japan.

Figure 4:
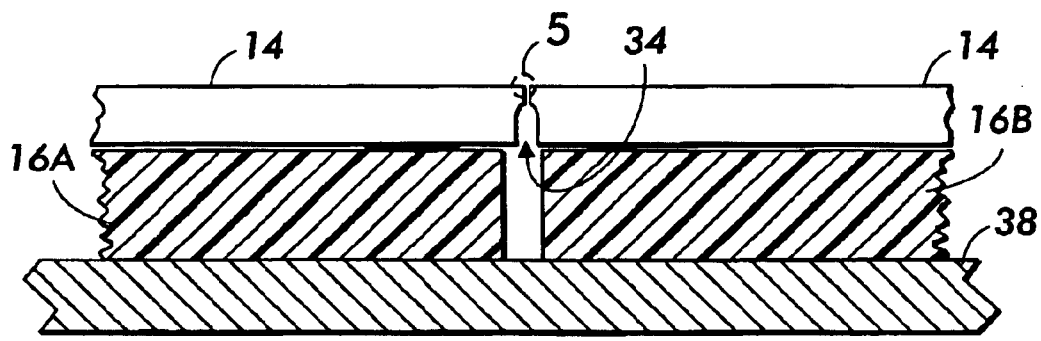
FIG. 4 is a cross sectional view taken along line 4—4 of FIG. 2.

Referring now to FIGS. 2 and 4, a portion of the semiconductor chip 14 at the end of each printed wiring board 16 overhangs or projects beyond the end of the printed wiring board substrate. This overhang allows the imaging chips of adjacent subarrays to be placed proximate one another so that the end chip of one subarray 12A is immediately adjacent the end chip of the next subarray 12B. This arrangement allows the close spacing of the individual image elements, without the adjacent printed wiring boards 16 contacting one another. The exact amount of projection or overhang will vary by application, but should be sufficient to ensure that, within the manufacturing tolerances of the assembly system, adjacent imaging chips from adjacent subarrays may be placed in close proximity without the underlying printed wiring boards contacting one another. Thus, the nominal specifications should be such that, accounting for inherent variations in manufacturing repeatability, the end chip of each imaging subarray projects beyond the end of the printed wiring board. For example, a chip projection of 0.015 inch (0.038 mm) may be sufficient.

The end of each printed wiring board 16 that is adjacent another printed wiring board may be referred to as the joining edge. The end chip of the first subarray 12A that overhangs the joining edge of the first printed wiring board 16A is very closely spaced from the end chip of the second subarray 12B that overhangs the joining edge of the second printed wiring board 16B. Ideally, the chips are spaced so that the spacing between the end imaging element 18 of the first end chip and the end imaging element of the second end chip is the same as the spacing between the elements on each chip. For example, the chips may be spaced approximately 1–2 microns (0.00004–0.00008 inch) from one another. In some circumstances the chips 14 of the adjacent subarrays 12 may even abut one another. If each chip projects approximately 0.015 inch (0.38 mm), then the gap between the adjacent joining of the printed wiring board of the first subassembly and the printed wiring board of the second subassembly will be approximately 0.030 inch (0.76 mm).

The adjacent imaging subarrays 12 are joined together by tie bars 26. The tie bars 26 are formed of low expansion borosilicate glass having a coefficient of thermal expansion of approximately 3.25 ppm/° C. Exemplary glass of this type is Corning Pyrex 7740 or Schott Tampax 8330. A feature of this type of glass is that its coefficient of thermal expansion closely approximates the coefficient of thermal expansion of the semiconductor imaging chips 14. In certain circumstances, ordinary glass may be used to form the tie bars 26.

Each tie bar 26 is approximately 0.125 inch (3 mm) thick, has a length of approximately 0.787 inch (20 mm), and a width of 0.228 inch (5.8 mm). One side of each tie bar glass block is frosted, either chemically or mechanically. The frosted side is attached to the printed wiring board. Each tie bar 26 attaches two imaging subarrays 12 to one another. Preferably, the tie bars are secured to the printed wiring board substrates 16 upon which the imaging chips 14 are mounted. Two tie bars connect each pair of imaging subarrays. One tie bar is on either side of the imaging chips 14. The tie bars are attached to the same face of the printed wiring boards as are the imaging chips. Because the coefficient of thermal expansion of the glass tie bar is approximately the same as the coefficient of thermal expansion of the imaging chip, the spacing of the imaging elements 18 on the adjacent imaging chips 14 of the two subarrays remains virtually unchanged over a wide temperature range.

An adhesive 28 that is cured by a mechanism other than heat attaches the tie bars 26 to their respective printed wiring board substrate 16. Using a mechanism other than heat to cure the adhesive reduces the possibility of deforming the structure during assembly because of heat induced expansion of the substrate wiring board or other elements. In the preferred implementations, a light curable adhesive, and particularly an ultraviolet light curable adhesive, secures the tie bars 26 to the substrates 16. An exemplary adhesive is Loctite 352 UV-curable adhesive available from Loctite Corp. of Rocky Hill, Conn. A light curable adhesive polymerizes in the presence of high concentration radiant light. A UV curable adhesive polymerizes in the presence of UV light 30 (100–400 nanometer wavelength) from a light source 32. Other light curable adhesives polymerize in the presence of either UV or visible light (100–760 nanometer wavelength).

Figure 5:
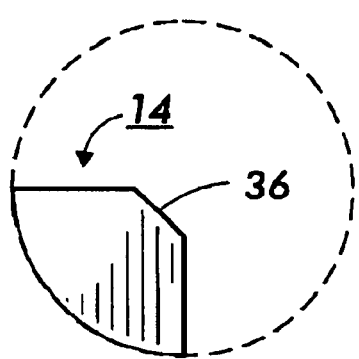
FIG. 5 is an enlarged view of the edge of one of the imaging chips incorporated in the assembly shown in FIG. 4.
Figure 6:
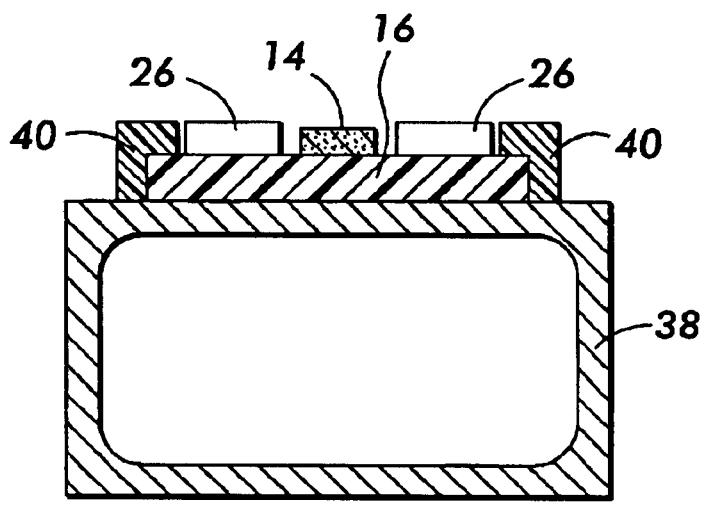
FIG. 6 is a cross sectional view taken along line 6—6 of FIG. 1.

Referring now to FIGS. 4 and 5, the edges of the silicon chips 14 are preferably cut in a fashion to facilitate the close placement of the chips relative to one another, and to reduce the possibility of fragmenting the corners of the chip. Referring first to FIG. 4, the adjacent edges of the sensor chips may include back cuts 34. These back cuts are open-ended grooves on the backsides of the silicon chips, at the edge of the chip. The back cut 34 counters the tendency of the lower portion of the chip to extend beyond the upper surface. Such lower extensions may tend to interfere with the ability to closely space the sensor chips. Such back cuts are shown, for example, in U.S. Pat. No. 4,814,296. In one application in which the sensor chips have a thickness of approximately 17 mils (0.43 mm), the back cuts at the edges thereof provide a thickness of each chip in the area of a back cut of about 6 mils (0.15 mm).

Referring next to FIG. 5, an enlarged view of the corner of a chip 14 shows a diagonal cut 36 along the upper edge of each sensor chip. The cut 36 is aligned with the crystalline structure of the chip, reduces the possibility of damage at the corner of the chip. Such diagonal cuts are well known to those familiar with the semiconductor arts, and are also described in U.S. Pat. No. 4,814,296. Such cuts are formed by a V shape groove in the upper surface of the silicon wafer at the point at which the wafer is to be divided into individual chips or die. The individual die are separated along the V shaped groove, by sawing or other methods that are conventional in the semiconductor arts.

In a method of forming an imaging apparatus in accordance with an aspect of the present invention, imaging subarrays 12 are formed by securing semiconductor imaging chips 14 to a substrate, such as a printed wiring board 16. The semiconductor imaging chips are secured to the printed wiring board substrate using attachments conventional and well known in the semiconductor arts. The semiconductor imaging chip 14 at the end of the printed wiring board overhangs the end of the board.

Adjacent imaging subarrays 12 are brought proximate one another, with the joining end of one board (with an overhanging chip) adjacent the joining end of the other board (also with an overhanging chip). The projecting end chip of one subarray is positioned immediately adjacent the projecting end chip of the next subarray. The imaging subarrays are aligned so that the imaging elements 18 of the chips are exactly aligned with one another. The end chips of the adjacent subarrays may even be brought into contact with one another.

During the assembly process, the imaging subarrays can be held in place on an assembly supporting structure or jig, such as the aluminum frame 38 shown in FIG. 1. Clips 40 hold the printed wiring board 16 of each subarray 12 in place until the tie bars 26 are affixed with the adhesive 28.

Figure 3:
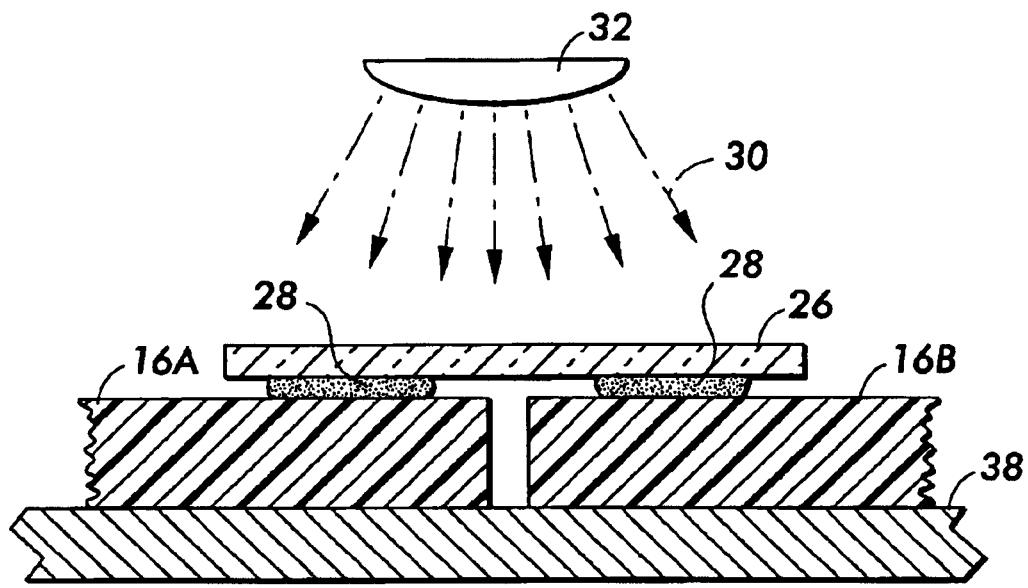
FIG. 3 is a cross sectional view taken along line 3—3 of FIG. 2.

Referring particularly to FIG. 3, a portion of light curable adhesive 28 is applied to the upper surface of each of the adjacent printed wiring boards 16A, 16B. The glass tie bar 26 is then positioned so that one portion of the tie bar (preferably near one end thereof) contacts the light curable adhesive on the first board 16A, and a second portion of the tie bar (preferably at the other end thereof) contacts the light curable adhesive on the second board 16B. Light 30 is then directed from a light source onto the light curable adhesive 28. In the case of UV curable adhesive, this light should be ultraviolet light, with a wavelength of approximately 375 nm, and wavelength of between 100 nm and 400 nm. In the illustrated arrangement, light is directed through the tie bar itself, so the glass of the tie bar should be transparent or substantially transparent to light of the wavelength appropriate for curing the adhesive. Light curable adhesives require a light intensity at the adhesive of between approximately 25 mW/cm and 100 mW/cm. The intensity of the light source 32 may need to be adjusted to account for the possibility that the glass tie bar itself may absorb some of the light energy. The specific wavelength and intensity of light required depends on the particular adhesive chosen, and is specified in the adhesive manufacturer's documentation.

As is understood by those familiar with light curable adhesives, the adhesive 28 becomes "tacky" as soon as the adhesive is exposed to light, and is cured within a very short time, such as 5 seconds for a very high intensity light source, and slightly longer for relatively lower intensity sources. Because of the rapid cure time, the probability of relative movement among the parts during the curing process is minimized.

Preferably, the assembly is not moved between when the subarrays are positioned relative to one another and when the adhesive is cured. Moving the assembly may alter the spatial relationships among the imaging chips. Temperature changes during subarray assembly should also be avoided. Temperature induced expansion or contraction of the printed wiring boards, and differential expansion or contraction between the printed wiring boards 16 and the assembly supporting structure 38 may also alter the spatial relationship among the imaging chips. After the tie bars 26 have been affixed to the printed wiring boards, the clips 40 may be unfastened, and the entire imaging assembly can be removed from the assembly supporting structure 38.

The present invention has been described in the context of a particularly preferred embodiment. Those familiar with the art will recognize that numerous modifications can be made to the particular embodiment described above. For example, other shapes and configurations for the arrangement for the sensor element and the sensor subarray may be appropriate in certain circumstances. The tie bars can be secured to the lower surface of the printed wiring boards, or some of the tie bars can be secured to the upper surface of the printed wiring boards, while others are secured to the lower surface. Also, other types of adhesives, and other materials for the tie bar may also be appropriate in certain circumstances. Therefore, the scope of the present invention should not be limited by the above description of a particular embodiment.

What is claimed is:

1. An imaging apparatus, comprising:
   a first imaging subarray comprising a first printed wiring board having a joining end and a plurality of first semiconductor imaging chips mounted on the first printed wiring board, including a first end chip, wherein a portion of the first end chip projects beyond the joining end of the first printed wiring board;
   a second imaging subarray comprising a second printed wiring board having a joining end, and a plurality of second semiconductor imaging chips mounted on the second printed wiring board, including a second end chip, wherein a portion of the second end chip projects beyond the joining end of the second printed wiring board; and
   a glass tie bar connecting the first and second imaging subarrays, wherein:
      a first portion of the glass tie bar is attached to the first printed wiring board with a light-curable adhesive; and
      a second portion of the glass tie bar is attached to the second printed wiring board with a light-curable adhesive.

2. The imaging apparatus of claim 1, wherein the first and second imaging subarrays are positioned so that the end chip of the first imaging subarray is adjacent the end chip of the second imaging subarray.

3. The imaging apparatus of claim 2, additionally comprising a second glass tie bar connecting the first and second imaging subarrays, wherein:
   a first portion of the second glass tie bar is attached to the first printed wiring board with a light-curable adhesive; and
   a second portion of the second glass tie bar is attached to the second printed wiring board with a light-curable adhesive.

4. The imaging apparatus of claim 3, wherein:
   the first imaging chips are linearly aligned with one another on the first printed wiring board;
   the second imaging chips are linearly aligned with one another on the second printed wiring board; and
   the first and second imaging subarrays are positioned so that the first and second imaging chips are linearly aligned with one another.

5. The imaging apparatus of claim 4 wherein:
   the end chip of the first semiconductor imaging chip projects approximately 0.015 inch beyond the joining end of the first printed wiring board; and
   the second semiconductor imaging chip projects approximately 0.015 inch beyond the joining end of the second printed wiring board.

6. The imaging apparatus of claim 5 wherein the glass tie bars have a coefficient of thermal expansion substantially similar to the coefficient of thermal expansion of the first and second chips.

7. The imaging apparatus of claim 5 wherein the glass tie bars have a coefficient of thermal expansion of approximately 3.25 parts per million per degree Celsius.

8. The imaging apparatus of claim 3 wherein the glass tie bars are substantially transparent to the light appropriate for curing the light-curable adhesive.

9. A method of forming an imaging apparatus, the method comprising:
   forming a first imaging subarray comprising a first printed wiring board having a joining end and a plurality of first semiconductor imaging chips mounted on the first printed wiring board, including a first end chip, wherein a portion of the first end chip projects beyond the joining end of the first printed wiring board;
   forming a second imaging subarray comprising a second printed wiring board having a joining end and a plurality of second semiconductor imaging chips mounted on the second printed wiring board, including a second end chip, wherein a portion of the second end chip projects beyond the joining end of the second printed wiring board;

bringing the first imaging subarray into proximity with the second imaging subarray so that the first end chip is immediately adjacent the second end chip;

applying light-curable adhesive to the first printed wiring board and to the second printed wiring board;

placing a glass tie bar so that a first portion of the tie bar contacts the light-curable adhesive on the first printed wiring board, and a second portion of the tie bar contacts the light-curable adhesive on the second printed wiring board; and directing light onto the light-curable adhesive to cure the light-curable adhesive.

10. The method of claim 9, wherein the step of directing light onto the light-curable adhesive comprises directing light through the glass tie bar to the light-curable adhesive.

11. The method of claim 9, wherein the step of directing light onto the light-curable adhesive comprises directing ultraviolet light onto the light-curable adhesive.

* * * * *